(12) United States Patent
Huster et al.

(10) Patent No.: US 6,548,335 B1
(45) Date of Patent: Apr. 15, 2003

(54) SELECTIVE EPITAXY TO REDUCE GATE/GATE DIELECTRIC INTERFACE ROUGHNESS

(75) Inventors: Carl Robert Huster, San Jose, CA (US); Concetta Riccobene, Mountain View, CA (US); Scott Luning, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/651,891

(22) Filed: Aug. 30, 2000

(51) Int. Cl.[7] .................. H01L 21/336; H01L 21/8234
(52) U.S. Cl. ................ 438/197; 438/478; 438/585; 438/770
(58) Field of Search ................. 438/197, 294, 438/585, 765, 770, 151, 198, 216, 287, 404, 478, 591, 764, 787, 769, 773

(56) References Cited

U.S. PATENT DOCUMENTS 5,428,234 A * 6/1995 Sumi ..................... 257/287
6,064,077 A * 5/2000 Sandaresan ................. 257/23
6,429,061 B1 * 8/2002 Rim ........................... 438/198

FOREIGN PATENT DOCUMENTS

| JP | 07176742 A | * 7/1995 | |
| WO | WO 97/28560 | * 8/1997 | H01L/21/28 |

OTHER PUBLICATIONS

Silicon Processing For The VLSI Era, vol. 1, Process Technology, Stanley Wolf, Ph.D., Richard N. Tauber, Ph.D., pp. 155–156.

* cited by examiner

Primary Examiner—Matthew Smith
Assistant Examiner—Craig P. Lytle

(57) ABSTRACT

Channel carrier mobility is increased by reducing gate/gate dielectric interface roughness, thereby reducing surface scattering. Embodiments include depositing a layer of silicon by selective epitaxy prior to gate oxide formation to provide a substantially atomically smooth surface resulting in a smoother interface between the gate polysilicon and silicon oxide after oxidation.

10 Claims, 2 Drawing Sheets

SELECTIVE EPITAXY TO REDUCE GATE/GATE DIELECTRIC INTERFACE ROUGHNESS

FIELD OF THE INVENTION

The present invention relates to a method of manufacturing semiconductor devices, e.g., MOS-type transistors and integrated circuits comprising such devices exhibiting improved quality, e.g., improved channel carrier mobility, high transistor drive current and improved circuit performance. The present invention is particularly applicable in fabricating high-density integration semiconductor devices with a design rule less than about 0.18 micron, e.g., about 0.15 micron and under.

BACKGROUND OF THE INVENTION

The escalating requirements for high density and performance associated with ultralarge-scale integration (ULSI) semiconductor devices require a design rule of 0.18 micron and below, e.g., about 0.15 micron and below, increased transistor and circuit speeds, high reliability and quality, and increased manufacturing throughput for economic competitiveness. The reduction of design rules to 0.18 micron and below challenges the limitations of conventional semiconductor manufacturing techniques.

High performance microprocessor applications require rapid speed of semiconductor circuitry. A limitation on the drive current of a transistor stems from reduced carrier mobility, i.e., electron or hole mobility, in the channel region of a MOSFET. The reduction of channel carrier mobility reduces the drive current and performance of the circuit.

Accordingly, there exists a need for efficient, cost-effective methodology for manufacturing MOS devices exhibiting improved transistor drive current and circuit performance. There exists a particular need for such methodology for fabricating semiconductor devices having a design rule less than about 0.15 micron and under that is compatible with conventional process flow for improved efficiency and increased manufacturing throughput.

DISCLOSURE OF THE INVENTION

An advantage of the present invention is an improved method for forming semiconductor devices with increased channel carrier mobility, improved transistor drive current and improved circuit performance.

Additional advantages and other features of the present invention will be set forth in the description that follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, the method comprising: forming a field dielectric region isolating an active region in a semiconductor substrate; growing a layer of semiconductor material in the active region by selective epitaxy; thermally oxidizing a surface of the epitaxially grown layer to form a gate oxide layer; and depositing a gate electrode layer on the gate oxide layer.

Embodiments of the present invention comprise forming a silicon oxide isolation region on a silicon semiconductor substrate, depositing silicon by selective epitaxy on the active region by a mechanism which is predominantly monolayer by monolayer; thermally oxidizing the surface of the epitaxially deposited silicon to form a gate oxide layer having a substantially smooth surface and forming a gate electrode layer on the gate oxide layer. Embodiments of the present invention also comprise growing the layer of silicon by selective epitaxy to a thickness of about 5 Å to about 10 Å and forming the gate oxide layer at a thickness of about 3Å to less than about 20 Å.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are susceptible of modification in various obvious respects, all without departing from the spirit of the present invention. Accordingly, the drawing and description art to be regarded as illustrative in nature, and not as restrictive.

DESCRIPTION OF THE INVENTION

Figure 1:
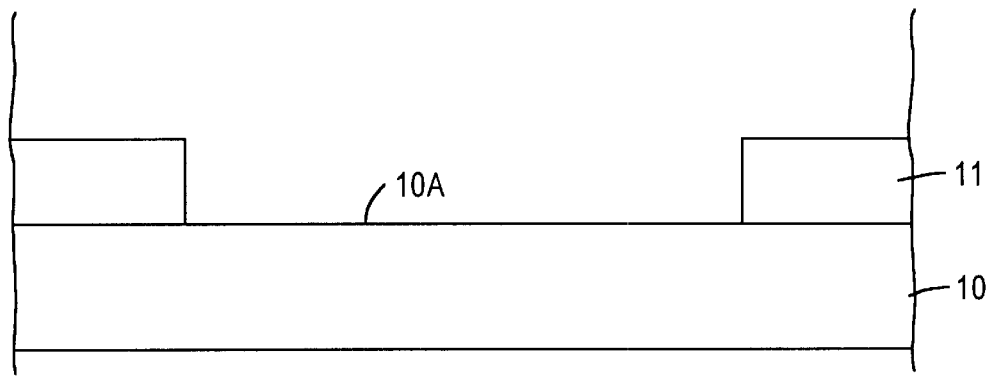
FIGS. 1 through 4 schematically illustrate sequential steps in accordance with an embodiment of the present invention, wherein like reference numerals denote like features.

The present invention addresses and solves the reduced channel carrier mobility problem in MOSFETs which limit the drive current of the transistor and, hence, circuit performance. The reduction in channel carrier mobility can occur by scattering as the result of impurities, vibrations or surface irregularities. It is believed that the predominant factor responsible for carrier scattering through the silicon lattice is due to surface roughness between the gate electrode layer and underlying gate dielectric layer, e.g., the silicon/silicon oxide interface. This problem is believed to be exacerbated as the thickness of gate oxide layer is reduced to below about 50 Å, e.g., below about 20 Å, in order to satisfy reduced design rule requirements necessitated by the drive toward miniaturization. The problem of carrier scattering at the gate/gate oxide interface is believed to be exacerbated as the gate oxide layer is reduced in thickness due to thin, atomic scale roughness introduced by oxidation of the silicon surface prior to gate formation, since a silicon atom diameter is about 5.4 Å.

It was found that when a silicon oxide layer is formed, atomic scale variations appear on the surface of the gate oxide layer. These atomic scale variations in surface roughness increase carrier scattering and, hence, reduce channel carrier mobility. By the present invention, the surface roughness of relatively thin gate oxide layers, e.g., less than about 50 Å, such as less than about 20 Å, is improved by providing a silicon layer having a substantially atomically smooth surface prior to oxidation.

It is believed that the surface roughness of the underlying silicon layer prior to thermal oxidation to form the gate oxide layer carries through in that the surface of the gate oxide layer is rough at the interface with the gate electrode layer. The present invention, therefore, addresses the gate/gate dielectric interface roughness problem by improving the smoothness of the surface of the underlying silicon before forming the gate dielectric layer.

Embodiments of the present invention comprise forming a field oxide region isolating an active region, and growing by selective epitaxy a layer of silicon such that growth occurs substantially monolayer by monolayer to form a substantially atomically smooth silicon surface wherein the surface roughness is confined entirely within an atomic layer. The formation of a substantially atomically smooth silicon layer prior to oxidation carries through in that the surface of the resulting silicon oxide layer is, consequently, significantly smoother vis-à-vis an oxidized silicon surface without conducting selective epitaxy. The resulting smooth silicon oxide layer provides a significantly smoother interface with the subsequently formed gate electrode to significantly reduce carrier scattering through the lattice. Accordingly, channel carrier mobility in the MOSFET is significantly increased with an attendant increase in transistor drive current and improvement in circuit performance.

There are various conventional methods for depositing silicon by selective epitaxy. Accordingly, such techniques are not set forth herein in great detail. For example, see "Silicon Processing For The VLSI Era, Vol. 1, Wolf et al., 1986, pages 155 and 156. Basically, selective epitaxial deposition can be implemented without substantial deposition of silicon on the field oxide region when silicon atoms possessing high surface mobility are deposited from the silicon source and migrate to sides on the single crystal material where nucleation is favored. Embodiments of the present invention comprise growing a silicon layer by selective epitaxy to a thickness up to about 200 Å such as up to about 100 Å, e.g., up to about 50 Å. However, suitable results are achieved by growing a layer of silicon by selective epitaxy to a thickness sufficient to provide substantially atomically smooth surface, such as about 5 Å to about 10 Å or about one to about two or three monolayers.

Figure 2:
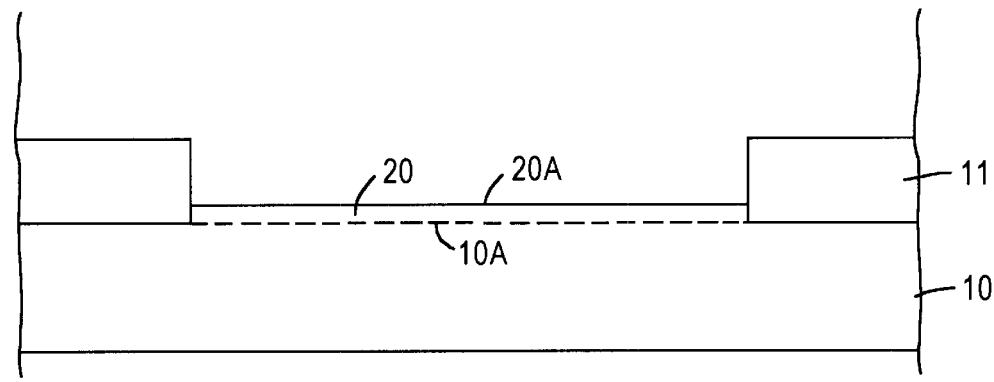

An embodiment of the present invention is schematically illustrated in FIGS. 1 through 4. Adverting to FIG. 1, field oxide region 11 is formed on silicon substrate 10 leaving a relatively coarse surface 10A. As shown in FIG. 2, a layer of silicon 20 is grown to a thickness of about 5 Å to about 10 Å by selective epitaxy, without deposition on field oxide region II, on surface 10A. Silicon layer 20 is grown by selective epitaxy wherein growth occurs substantially monolayer by monolayer such that the entire surface roughness is confined to within a monolayer. Hence, the surface 20A of silicon layer 20 is substantially atomically smooth. The previous rough upper surface 10A is indicated by a dashed line.

Figure 3:
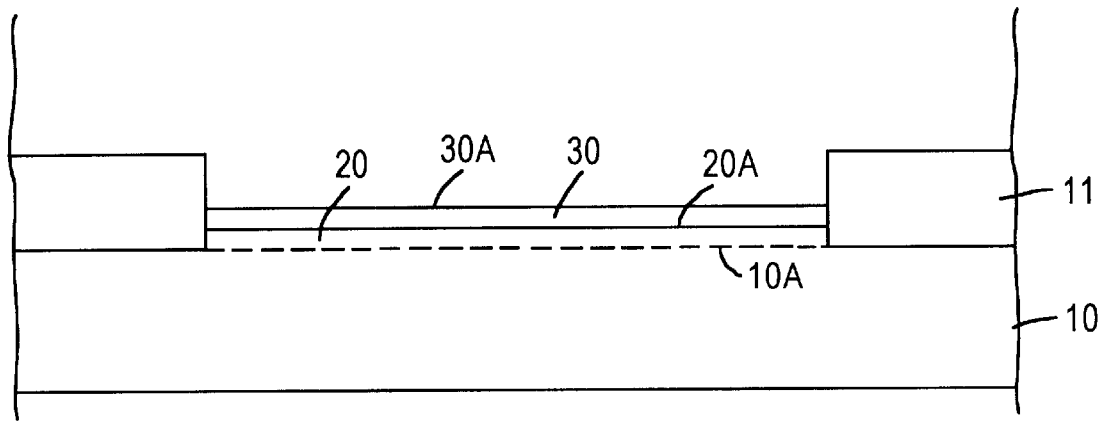
Figure 4:
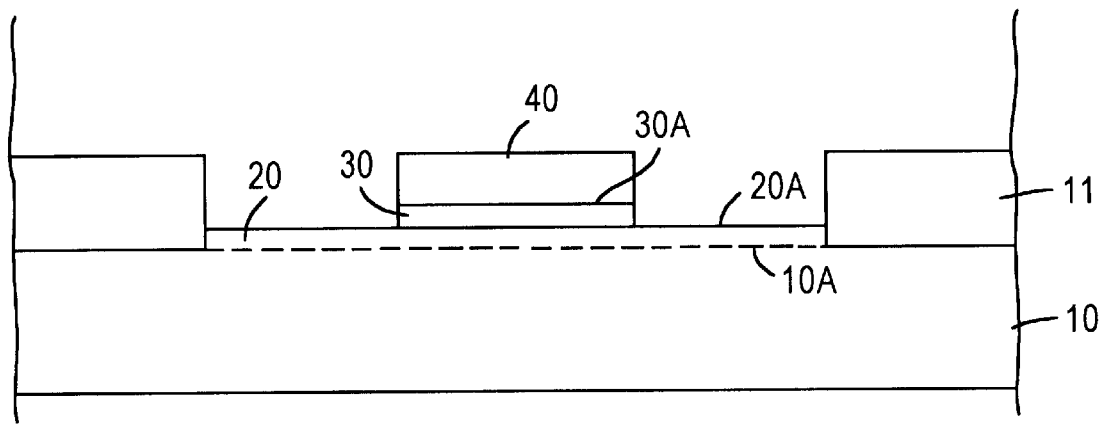

Adverting to FIG. 3, the substantially atomically smooth surface 20A of silicon layer 20 is oxidized to form silicon oxide layer 30, at a thickness of about 3 Å to less than about 20 Å, having a substantially smooth surface 30A by virtue of the substantially atomically smooth surface 20A of the underlying silicon layer. Subsequently, as in conventional practices, a gate electrode layer is deposited and patterned to form a gate stack comprising gate electrode 40 on underlying gate oxide layer 30 as shown in FIG. 4. Subsequent processing proceeds in a conventional manner, as by forming source/drain regions to complete the MOSFET.

The present invention enjoys industrial utility in manufacturing any of various types of semiconductor devices. The present invention enjoys particular industrial utility in enabling manufacturing semiconductor devices having submicron features, e.g., a design rule less than about 0.18 micron, such as less than about 0.15 micron, with improved channel carrier mobility by reducing the surface roughness between the gate electrode and underlying gate dielectric layer. The reduction in interface roughness is achieved by growing a layer of silicon by selective epitaxy immediately prior to thermal oxidation to form the gate oxide layer. Selective epitaxy provides a layer of silicon having a substantially atomically smooth surface. Consequently, the surface of the thermal oxide layer formed thereon is also substantially smooth, with an attendant reduction in surface scattering. The reduction in surface scattering improves channel carrier mobility and, hence, increases the drive current of the transistor and improves circuit performance.

In the previous description, numerous specific details are set forth, such as specific materials, structures and processes, in order to provide a better understanding of the present invention. However, the present invention can be practiced without resorting to the details specifically set forth. In other instances, well known processing materials and techniques have not been described in order not to unnecessarily obscure the present invention.

Only the preferred embodiment of the present invention and but a few examples of its versatility are shown and described in the present disclosure. It is to be understood that the present invention is capable of use in various combinations and environments and is susceptible of changes and/or modifications within the scope of the inventive concept as expressed herein.

What is claimed is:

1. A method of manufacturing a semiconductor device, the method comprising:

forming a field dielectric region isolating an active region in a semiconductor substrate;

growing a layer of semiconductor material in the active region by selective epitaxy at a thickness of about 5 Å to about 10 Å; thermally oxidizing a surface of the epitaxially grown layer to form a gate oxide layer; and depositing a gate electrode layer on the gate oxide layer.

2. The method according to claim 1, wherein:

the semiconductor material and gate electrode comprise silicon; and the gate oxide and field dielectric region comprise silicon oxide.

3. The method according to claim 2, comprising depositing silicon by selective epitaxy so that silicon is deposited substantially monolayer by monolayer.

4. The method according to claim 3, wherein the layer of silicon deposited by selective epitaxy has a surface that is substantially atomically smooth with a surface roughness within an atomic layer.

5. The method according to claim 4, wherein the gate oxide has a surface which is substantially smooth due to the substantially atomically smooth surface of the layer of the underlying silicon deposited by selective epitaxy.

6. The method according to claim 2, comprising depositing silicon by selective epitaxy with substantially no silicon depositing on the field oxide region.

7. The method according to claim 3, wherein the gate oxide has a thickness less than about 50 Å.

8. The method according to claim 7, wherein the gate oxide has a thickness less than about 20 Å.

9. The method according to claim 8, wherein the gate oxide has a thickness of about 3 Å to less than about 20 Å.

10. The method according to claim 2, comprising depositing the silicon by selective epitaxy at a thickness at about one to about two monolayers.

* * * * *